(12) United States Patent
Meurer et al.

(10) Patent No.: US 11,459,146 B2
(45) Date of Patent: Oct. 4, 2022

(54) COATING APPARATUS WITH HALF OPEN LOOP

(71) Applicant: ARKEMA B.V., Vondelingenplaat-Rotterdam (NL)

(72) Inventors: Oliver Meurer, Willich (DE); Joannes Theodorus Maria Wagemakers, Ka Doetinchem (NL)

(73) Assignee: Arkema France, Colombes (FR)

( * ) Notice: Subject to any disclaimer, the term of this patent is extended or adjusted under 35 U.S.C. 154(b) by 3 days.

(21) Appl. No.: 14/787,806

(22) PCT Filed: Apr. 30, 2014

(86) PCT No.: PCT/EP2014/058899
§ 371 (c)(1),
(2) Date: Oct. 29, 2015

(87) PCT Pub. No.: WO2014/177651
PCT Pub. Date: Nov. 6, 2014

(65) Prior Publication Data
US 2016/0101898 A1    Apr. 14, 2016

(30) Foreign Application Priority Data
Apr. 30, 2013   (EP) .................................... 13166033

(51) Int. Cl.
*C23C 16/54*    (2006.01)
*B65D 23/08*    (2006.01)
(Continued)

(52) U.S. Cl.
CPC ........ *B65D 23/0807* (2013.01); *C03C 17/005* (2013.01); *C23C 16/045* (2013.01); *C23C 16/45595* (2013.01); *C23C 16/54* (2013.01)

(58) Field of Classification Search
None
See application file for complete search history.

(56) References Cited

U.S. PATENT DOCUMENTS 3,645,778 A  *  2/1972  Nesteruk .................. B05B 5/08
                                                                65/60.5
4,389,234 A       6/1983  Lindner
(Continued)

FOREIGN PATENT DOCUMENTS

EP       0 378 116 A1    7/1990
EP       0 378 116 B1    7/1990
(Continued)

*Primary Examiner* — Karla A Moore
(74) *Attorney, Agent, or Firm* — Lynn B. Morreale

(57) ABSTRACT

The present invention relates to a coating apparatus also called coating tunnel or coating hood for applying a protective coating to hollow glass containers. In particular it relates to a coating apparatus also called coating tunnel or coating hood with the re-use of the coating material containing exhaust from the end of the coating tunnel for applying the protective coatings to glass containers. More particularly the present invention relates to a coating apparatus also called coating tunnel or coating hood with an additional half-loop that re-uses the coating material containing exhaust from the end of the coating tunnel at the entrance of the tunnel while replacing fresh air.

5 Claims, 1 Drawing Sheet

Figure 1:
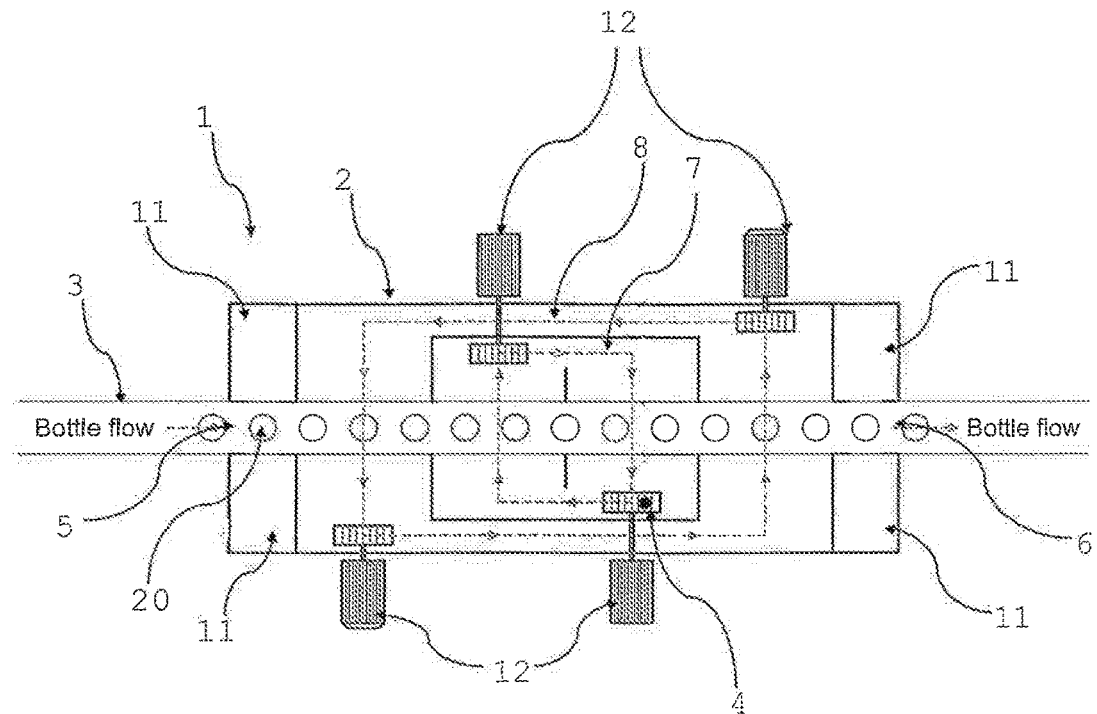

(51) Int. Cl.
*C03C 17/00* (2006.01)
*C23C 16/455* (2006.01)
*C23C 16/04* (2006.01)

(56) References Cited

U.S. PATENT DOCUMENTS

| | | | | |
|---|---|---|---|---|
| 4,431,692 A | * | 2/1984 | Hofmann | C03C 17/005 65/60.2 |
| 4,668,268 A | * | 5/1987 | Lindner | C03C 17/005 65/60.2 |
| 4,879,970 A | * | 11/1989 | Barkalow | C03C 17/005 118/719 |
| 5,140,940 A | | 8/1992 | Lindner | |
| 5,599,369 A | * | 2/1997 | Townsend | C03C 17/005 118/602 |
| 2004/0096588 A1 | * | 5/2004 | Brandt | B65D 23/0821 427/385.5 |

FOREIGN PATENT DOCUMENTS

| WO | WO 96/33955 | 10/1996 |
|---|---|---|
| WO | WO 01/25503 A | 4/2001 |

* cited by examiner

COATING APPARATUS WITH HALF OPEN LOOP

CROSS-REFERENCE TO RELATED APPLICATIONS

This application is a national stage application under 35 U.S.C. § 371 of PCT/EP2014/058899, filed Apr. 30, 2014, which claims benefit to European patent application EP13166033.4, filed Apr. 30, 2013.

FIELD OF THE INVENTION

The present invention relates to a coating apparatus also called coating tunnel or coating hood for applying a protective coating to hollow glass containers.

In particular it relates to a coating apparatus also called coating tunnel or coating hood with the re-use of the coating material containing exhaust from the end of the coating tunnel for applying the protective coatings to glass containers.

More particularly the present invention relates to a coating apparatus also called coating tunnel or coating hood with an additional half-loop that re-uses the coating material containing exhaust from the end of the coating tunnel at the entrance of the tunnel while replacing fresh air.

TECHNICAL PROBLEM

Hollow glass containers are produced from molten glass at moulds at high temperatures. As the surface of these containers is fragile and in order to preserve the strength of the glass and to prevent any direct glass to glass contact of the respective containers in order to avoid damage, they are surface coated directly after forming of the container.

Such a coating that includes tin or tin tetrachloride, titanium or other heat decomposable metallic or organometallic compounds protects the glass container surface in from damage such as abrasions and scratches, which result in a loss of tensile strength for the glass container. The need for high tensile strength in a glass container is particularly acute when containers are mass produced, move rapidly in close proximity along high speed conveyor lines.

This coating application is done inside a coating apparatus also called a coating tunnel or coating hood with a so called hot end coating by chemical vapor deposition usually in forming a thin layer of a metal oxide, for example tin oxide. The objective is to coat the outside of the bottle with a homogenous even layer except for the so called finish.

The coating tunnel or coating hood receives the glass containers via a conveyer belt from the glass container making equipment with a relatively high speed, meaning between 0.3 up to 1.5 m/s which corresponds to approximately 90 to 700 glass containers per minute. The temperature of the containers excess 400° C. at the surface of the containers, so that when the heat decomposable inorganic metallic or organometallic compound (coating compound) is applied thereto, said compound reacts immediately and is converted to a metal oxide coating. The coating compound is fed in the coating tunnel and circulates inside with the aid of a carrier gas around the passing glass containers.

As the glass containers pass the coating hood at this high speed they risk to draw the coating compound out of the tunnel when leaving the hood through the outlet. The coating compound can attack building components and give health and safety issues. A venting system has to be installed for above mentioned reasons. For avoiding and minimizing this, the carrier gas comprising the coating compound is sucked into an exhaust system and is discarded. Consequently the coating compounds and chemicals are lost and the coating performance in view of introduced coating chemical is rather low.

On the other side when entering the tunnel through the inlet the glass containers draw in fresh air from the outside. In doing so they dilute the coating compound inside the tunnel. In order to apply a minimum necessary coating thickness on the glass containers more coatings compound has to be introduced in order to guarantee the required concentration of the coating chemical in the coating hood or tunnel for the chemical vapor deposition.

There is still the need for more efficient glass coating hoods, with low losses of the coating compound material to the atmosphere.

An objective of the present invention is to have a lower consumption of the coating chemical while applying the same thickness of coating to the glass container.

Another objective of the present invention is to lower the discharge of the coating chemical.

Still another objective of the present invention is to lower the emissions of chemicals in the coating area and near the coating tunnel or coating hood.

Again another objective of the present invention is to efficiently reduce the extent of exchange between ambient air and the gas in the tunnel especially at the entry.

Surprisingly it has been found that with a half loop going from the exit to the entry of the coating tunnel all the before mentioned problems can be solved.

BACKGROUND OF THE INVENTION

Prior Art

Coating Apparatus for Glass Containers are Well Known from the Prior Art.

The document U.S. Pat. No. 4,389,234 describes a glass coating hood possessing two or multiple loops. The coating is first fed into an innermost loop and then in an outermost loop. There is also a possibility of using a third loop, but all loops are recirculating loops in order to make better use of the coating material. Consequently the concentration of the coating compound decreases which each recirculating loop. At the end the non used coating compound enters an exhaust system.

The document U.S. Pat. No. 5,140,940 describes also a double loop coating hood, as described before. The coating apparatus based on its respective embodiments contains single or multiple air circulating loops.

The document EP0378116 describes a hot end coating apparatus. The hot end coating apparatus has two additional separate air circuits in the inlet and outlet region of a vapour-deposition hood. The air circuits produce two opposite flow zones flowing through the vapour-deposition hood in the transverse direction, the inner flow zone being enriched to the maximum degree with a coating agent and the outer flow zone forming a protective air curtain consisting of the used air from the coating zone, the degree of enrichment of the said air being correspondingly lower. However two additional feed points of the coating agent are needed one for each circuit.

The document WO2001/0255503 describes a glass container coating hood having additional loops; in one embodiment one loop of air or in another embodiment the hood uses counter current loops of air for carrying the coating.

The document WO96/33955 describes a method and apparatus for applying a layer to bottles. The method is made by a coating apparatus that comprises a gas curtain screening apparatus arranged before the inlet and/or after the outlet of the coating tunnel.

Non of the cited prior art discloses a coating apparatus having a half open loop going from the outlet to the inlet (5) of the coating tunnel.

BRIEF DESCRIPTION OF THE INVENTION

Surprisingly it has also been discovered that the a coating apparatus for applying a coating glass on containers with a chemical compound comprising:
- a housing (2) with a coating tunnel
- a conveyer belt (3) moving the containers (20) through the coating tunnel from the inlet (5) to the outlet (6) of the said coating tunnel
- one primary loop (7)
- a half open loop (9) going from the outlet (6) to the inlet (5) of the coating tunnel solves the above mentioned problems.

It has also been found that a process of applying a coating on the surface of glass containers comprising the steps of:
- conveying the glass containers (20) through a coating tunnel from the inlet (5) to the outlet (6)
- blowing gas comprising the coating generating compound with a primary loop (7) and one or more recirculating loops (8) through the coating tunnel
- introducing fresh air (10) at the proximity of the outlet (6) of the coating tunnel and said air is mixed with the at least a part of carrier gas comprising the coating generating compound can solve the above mentioned problems.

Surprisingly it has also been discovered that the introduction of a half open loop (9) going from the outlet (6) to the inlet (5) of the coating tunnel of a coating apparatus for applying a coating glass on containers with a chemical compound, reduces the consumption of the coating chemical and lower the discharge of the coating chemical.

The invention is best understood from the following detailed description when read in connected with the accompanying drawings with the following figures:

FIG. 1: schematic representation of existing hood from the state of the art with a recirculation loop.

Figure 2:
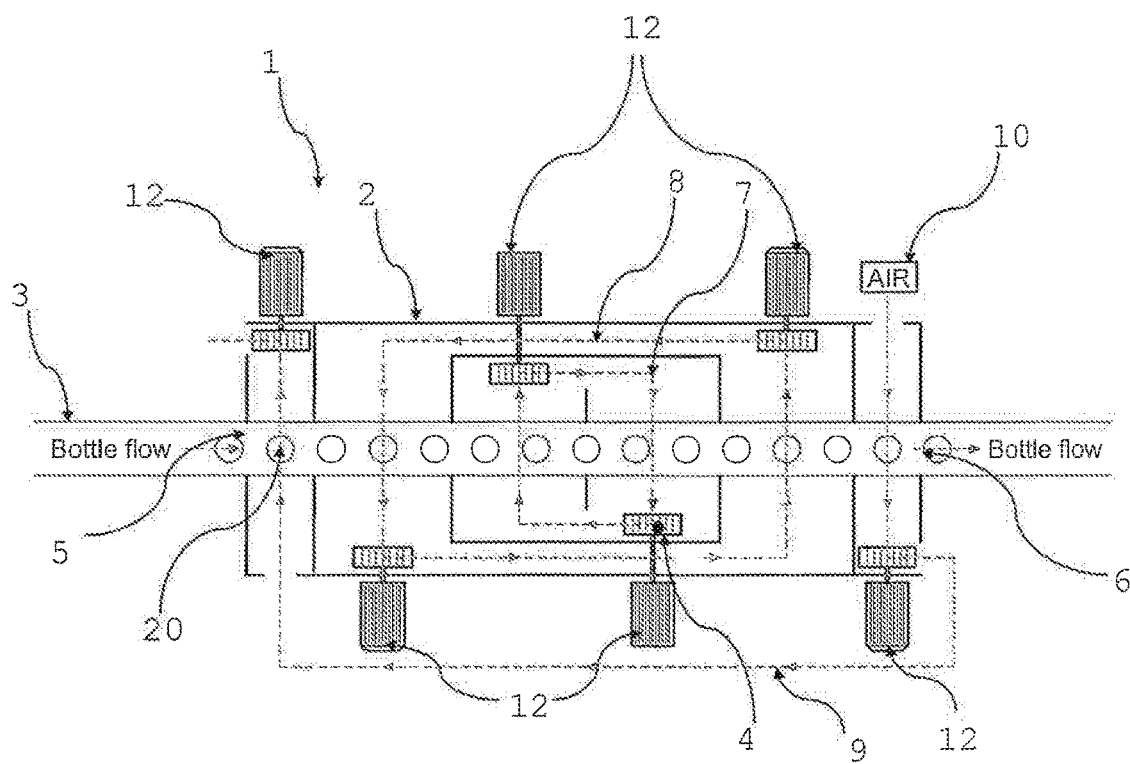

FIG. 2: schematic representation of the hood according to one embodiment of the present invention with an additional half open loop (9).

DETAILED DESCRIPTION OF THE INVENTION

In a first aspect, the present invention relates to a coating apparatus for applying a coating glass on containers with a chemical compound comprising:
- a housing (2) with a coating tunnel
- a conveyer belt (3) moving the containers (20) through the coating tunnel from the inlet (5) to the outlet (6) of the said coating tunnel
- one primary loop (7)
- a half open loop (9) going from the outlet (6) to the inlet (5) of the coating tunnel In a second aspect the present invention relates to a process of applying a coating on the surface of glass containers comprising the steps of:
- conveying the glass containers (20) through a coating tunnel from the inlet (5) to the outlet (6)
- blowing gas comprising the coating generating compound with a primary loop (7) through the coating tunnel
- introducing fresh air (10) at the proximity of the outlet (6) of the coating tunnel and said air is mixed with the at least a part of carrier gas comprising the coating generating compound
- Exhausting the air that mixed with the at least a part of gas comprising the coating generating compound through a half open loop (9) and reintroducing this mixture at the proximity of the inlet (5) of the coating tunnel.

According to another aspect the present invention relates to a glass container on which a coating has been applied on its surface by a process comprising the steps of:
- conveying the glass containers (20) through a coating tunnel from the inlet (5) to the outlet (6)
- blowing gas comprising the coating generating compound with a primary loop (7) through the coating tunnel
- introducing fresh air (10) at the proximity of the outlet (6) of the coating tunnel and said air is mixed with the at least a part of carrier gas comprising the coating generating compound
- Exhausting the air that mixed with the at least a part of gas comprising the coating generating compound through a half open loop (9) and reintroducing this mixture at the proximity of the inlet (5) of the coating tunnel.

According to an additional aspect the present invention relates to a glass container on which a coating has been applied on its surface by a coating apparatus comprising:
- a housing (2) with a coating tunnel
- a conveyer belt (3) moving the containers (20) through the coating tunnel from the inlet (5) to the outlet (6) of the said coating tunnel
- one primary loop (7)
- a half open loop (9) going from the outlet (6) to the inlet (5) of the coating tunnel According to a variation of the present invention the coating apparatus can also comprise one or more recirculating loops (8). The recirculating loop or loops (8) is or are after the primary loop (7) and before the half open loop (9) latter going from the outlet (6) to the inlet (5) of the coating tunnel, in view of the passing of the coating generating compound.

By the generic term "air" as used is denoted the carrier gas that is used for the coating compound. It is obvious that any inert gas or a gas that is inert to the coating compound, the container and the interior of the coating hood, such as nitrogen could be used. Because of its convenience and low cost however the preferred gas is air.

By the term "coating compound" as used in the present invention is denoted a chemical compound that is introduced in the coating apparatus. The coating compound is used directly to coat a surface or it is transformed during the coating application in a another compound that forms the coating.

By the term "exhaust" as used is denoted the carrier gas that is still loaded with a quantity of the coating compound not applied to the glass container, that escapes at the entry and especially the outlet of the coating tunnel, where the containers enter and sort.

By the term "loop" as used in the present invention is denoted a circuit for the carrier gas or air loaded with the coating compound that enters and leaves twice the coating tunnel. In other words the loop or circuit makes a complete 360° turn.

By the term "primary loop" as used in the present invention is denoted a circuit that comprises a feed point of the coating compound and circulates the carrier gas or air loaded with the coating compound.

By the term "recirculating loop" as used in the present invention is denoted a circuit that does not comprise a feed point and that recirculates the carrier gas or air loaded with the coating compound coming from the primary loop.

By the term "half open loop" as used is denoted a circuit of carrier gas or air loaded with the coating compound that enters once and leaves twice the coating tunnel. In other words the loop or circuit makes a 180° turn. The end and the beginning of this loop have no common point.

With regard to the coating apparatus from the prior art, an embodiment of said coating apparatus is shown in FIG. 1. The coating apparatus comprises a housing (2) with coating tunnel, a conveyer belt (3) moving the containers (20) through the coating tunnel from the inlet (5) to the outlet (6) of the said coating tunnel, one primary loop (7) with a least one feedpoint (4) for the coating compound, one or more recirculating loops (8), blowing means (12) and exhaust means (11) in proximity of the inlet (5) end outlet (6).

With regard to the coating apparatus of the present invention, said coating apparatus comprises a housing (2) with coating tunnel, a conveyer belt (3) moving the containers (20) through the coating tunnel from the inlet (5) to the outlet (6) of the said coating tunnel, one primary loop (7) with a least one feedpoint (4) for the coating compound, blowing means (12), optionally one or more recirculating loops (8) and a half open loop (9) going from the outlet (6) to the inlet (5) of the coating tunnel.

In a preferred embodiment the coating hood according to the invention comprises one or more recirculating loops (8).

The position of the recirculating loop or recirculating loops can be behind the primary loop (in view of the movement of the conveyer belt) or around the primary loop as in FIGS. 1 and 2.

Additionally the coating apparatus comprises at least one blow slot and exhaust slot, that are not shown in the figures. The slots are respectively the entry or exit of the loop towards or from the central chamber of the coating hood, where the conveyer belt with the containers passes. By the blow slot the coating compound enters this chamber. By the exhaust slot the coating compound leaves this chamber.

Preferably each loop comprises at least one blow slot and exhaust slot.

Additionally the coating apparatus comprises blowing means or blowers (12). These blowers (12) keep the carrier gas with the coating compound circulating inside the hood and make is passing through the respective loops. The blower can either push the carrier gas with coating compound forward inside the centre section of the tunnel where the conveyer belt with the container passes or suck it outside.

Each loop comprises at least one blower (12).

Preferably the coating apparatus of the present invention comprises at least two loops: one primary loop (7) and at least one recirculating loop (8). With regard to the loops, the schematic drawings in FIGS. 1 and 2 each have one primary loop and one recirculating loop. The primary loop is an inner loop (7) and the recirculating loop is the outer loop (8). In the two loops the carrier gas comprising the coating compounds is transported in different directions. In the embodiments shown in FIGS. 1 and 2 the coating apparatus comprises one primary loop and one recirculating loop. The coating apparatus in FIG. 2 is one embodiment according to the present invention.

The coating compound is introduced through at least one feed point (4) in to the coating apparatus. This can be an internal feed point as in FIGS. 1 and 2 or an external feed point.

In one embodiment the feed point (4) is based at the primary loop (7) as an internal feed point as shown in FIGS. 1 and 2. The coating compound is introduced by the means of pipes, latter are not shown in the figures.

In another embodiment the coating compound is introduced by hot recirculating air as a side stream to dose the coating compound in, which is an external feed.

The hollow glass containers are transported in a single or double line by a conveyer through a tunnel formed in the coating hood under the housing. The conveyer carries the bottles in the direction designated by the arrow, in FIGS. 1 and 2 from left to right.

With regard to the coating compound introduced in the coating apparatus at one or more feedings points, it can be chosen from organometallic compounds, metal halides or other suitable compounds as coating compound precursor.

Preferably the coating compound is an organic tin halogenide, advantageously it is monobutyl tin trichloride.

With regard to the coating formed at the surface of the containers and applied in the hood it is a metal oxide as $SnO_2$, $TiO_2$, $Al_2O_3$ or $ZnO$. The metal oxide is derived from the decomposition inorganic or organometallic compounds.

Preferable the coating is tin oxide. The tin oxide is derived from the decomposition inorganic or organic tin compound advantageously of an organic tin halogenide, more advantageously from monobutyl tin trichloride.

With regard to the half-loop, it goes from the end or outlet (6) of the coating hood to the entry or inlet (5) of the coating hood (1). By end or outlet is meant the part of the hood where the coated containers are leaving the hood. By entry or inlet is meant the opening where the not yet coated containers enter the coating hood. The half loop comprises at least one exhaust and blow slot.

Fresh air (10) is introduced before the end of the coating hood, which is enriched with the hot carrier gas coming from the central area of the coating hood. Preferably the fresh air is introduced by a blow slot. Advantageously the fresh air is introduced by a blow slot at the opposite side of the beginning of the half loop (9). The air is enriched with the coating compound still present in the hot carrier gas.

The blow slot of the air inlet is in proximity of the outlet of the coating tunnel. By proximity is meant that the air inlet is between the outlet of the coating tunnel and the last loop in direction of the movement of the conveyer belt.

The air inlet at the outlet creates a lateral air flow in view of the bottle transport direction, meaning the movement of the conveyer belt. This lateral air flow creates a kind of curtain reducing the amount of carrier gas comprising still non used coating compound that might escape the coating apparatus or has to be exhausted.

The half loop transports this air enriched with the coating compound from the outlet to the inlet of the coating hood.

At least a part of the non used coating compound is re entering the coating process and is not lost or have not to be exhausted and discarded.

The half loop (9) comprises at least one blower (12) for circulating the mixture of air and carrier gas from the outlet to the inlet of the coating hood.

When the containers enter into the hood on a fast speed conveyer belt fresh air is sucked in at the inlet by a coating apparatus according to the prior art as in FIG. 1.

The half open loop according to the invention transports the air enriched with the coating compound and carrier gas from the outlet to the inlet of the coating hood. A kind of gas curtain is established at the inlet of the coating hood. This gas curtain comprises already hot carrier gas with a certain content of coating compound. This reduces enormously the amount of fresh air which is sucked in at the inlet. This avoids the dilution of the carrier gas of the first loop in direction of the conveyer belt.

The gas curtain at the inlet creates a lateral air flow in view of the bottle transport direction, meaning the movement of the conveyer belt.

Additionally the containers just entering the coating apparatus at the inlet might already begin to get slightly coated as this gas curtain comprises already hot carrier gas with a certain content of non used coating compound.

Additionally the temperature of the carrier gas in side the coating apparatus decreases less by the introduction of ambient air as this gas curtain comprises already hot carrier gas with a certain content of non used coating compound.

In one embodiment the half open loop comprises preferably at its end an exhaust mean.

Additionally the coating apparatus according to the invention can comprise means for exhaust. This can be either at the inlet or at the outlet or at the inlet and the outlet additional exhaust means are present.

With regard to the process of applying a coating on the surface of glass containers, it comprises the steps of:
- conveying the glass containers (20) through a coating tunnel from the inlet (5) to the outlet (6)
- blowing gas comprising the coating generating compound with one primary loop (7) through the coating tunnel
- introducing fresh air (10) at the proximity of the outlet (6) of the coating tunnel and said air is mixed with the at least a part of gas comprising the coating generating compound
- exhausting the air that mixed with the at least a part of gas comprising the coating generating compound through a half open loop (9) and introducing this mixture at the proximity of the inlet (5) of the coating tunnel.

Preferably the process of applying a coating on the surface of glass containers, it comprises after blowing the gas comprising the coating generating compound with the primary loop through the coating tunnel, additionally the step of blowing the gas comprising the coating generating compound with one or more recirculating loops through the coating tunnel.

With regard to the glass container on which a coating has been applied on its surface by a process comprising the steps of:
- conveying the glass containers (20) through a coating tunnel from the inlet (5) to the outlet (6)
- blowing gas comprising the coating generating compound with a primary loop (7)
- introducing fresh air (10) at the proximity of the outlet (6) of the coating tunnel and said air is mixed with the at least a part of carrier gas comprising the coating generating compound
- exhausting the air that mixed with the at least a part of gas comprising the coating generating compound through a half open loop (9) and reintroducing this mixture at the proximity of the inlet (5) of the coating tunnel.

Preferably the glass container on which a coating has been applied on its surface by a process that comprises additionally a step of blowing the gas comprising the coating generating compound with one or more recirculating loops (8) through the coating tunnel, after the primary loop (7) and before the half open loop (9) latter going from the outlet (6) to the inlet (5) of the coating tunnel.

With regard to the glass container on which a coating has been applied on its surface by a coating apparatus comprising:
- a housing (2) with a coating tunnel
- a conveyer belt (3) moving the containers (20) through the coating tunnel from the inlet (5) to the outlet (6) of the said coating tunnel
- one primary loop (7)
- a half open loop (9) going from the outlet (6) to the inlet (5) of the coating tunnel Preferably the glass container on which a coating has been applied on its surface by a coating apparatus that comprises additionally one or more recirculating loops (8) after the primary loop (7) and before the half open loop (9) latter going from the outlet (6) to the inlet (5) of the coating tunnel.

FIGURES

FIG. 1: schematic representation of existing hood from the state of the art with a recirculating loop.

Coating compound is introduced into the coating apparatus (1) or hood at a feed point (4). The hood (1) comprises a housing (2) and a conveyer belt (3) running there through. Containers (4) are transported on the belt, that moves them from the entrance or inlet (5) to the exit outlet (6) of the hood (1).

The containers (20) are only presented diagrammatically by circles.

The hood also comprises one primary loop (7) with a least one feedpoint (4) for the coating compound, one or more recirculating loops (8) and exhaust means (11) in proximity of the inlet (5) end outlet (6).

FIG. 2: schematic representation of the hood according to one embodiment of the present invention with an additional half loop (9).

Coating compound is introduced into the coating apparatus (1) or hood at a feed point (4). The hood (1) comprises a housing (2) and a conveyer belt (3) running there through. Containers (4) are transported on the belt, that moves them from the entrance or inlet (5) to the exit outlet (6) of the hood (1).

The containers (20) are only presented diagrammatically by circles.

The hood also comprises one primary loop (7) with a least one feedpoint (4) for the coating compound, one or more recirculating loops (8) and a half open loop (9) going from the outlet (6) to the inlet (5) of the coating tunnel.

The invention claimed is:

1. A coating apparatus (1) for applying a coating on glass containers with a chemical compound, said apparatus comprising:
- a housing (2) with a coating tunnel having an inlet where uncoated containers enter and an outlet where coated containers leave,
- a conveyer belt (3) to move the containers (20) through the coating tunnel from the inlet (5) to the outlet (6) of the coating tunnel,
- one or more primary loops (7) for circulating carrier gas or air loaded with a coating compound, said primary loop being a circuit comprising a feed point for the coating compound,
- optionally one or more recirculating loops (8) for recirculating carrier gas or air with coating compound from said primary loop, said recirculating loop being a circuit,
- a half open loop having a beginning and an end, a fresh air inlet (10) configured for introducing fresh air into the beginning of said half open loop (9), said fresh air inlet (10) being in proximity of and before the outlet (6) of the coating tunnel;

said half open loop starting at said outlet (6) where containers leave the tunnel and ending at said inlet (5) of the coating tunnel where uncoated containers enter the tunnel, which half open loop (9) is a carrier of said fresh air enriched with the coating compound, the beginning and end of said half open loop having no common point, one or more blowers for circulating the fresh air enriched with coating compound through said half open loop, from said outlet to said inlet of the coating tunnel;

whereby said half open loop (9) is not a primary or recirculating loop and wherein said half open loop (9) transports fresh air enriched with coating compound still present in hot carrier gas from the outlet of the coating tunnel to the inlet of the coating tunnel, such that at least a part of any non-used coating compound from the outlet of the coating tunnel re-enters the coating tunnel at the beginning of the tunnel for re-use, wherein the conveyor belt (3) delivers the glass containers (20) along a glass container path in a downstream direction, wherein the half open loop (9) includes (i) a first segment that is positioned downstream, as viewed along the glass container path, of an entirety of the primary loop (7), and (ii) a second segment that is fluidly connected to the first segment and positioned upstream, as viewed along the glass container path, of the entirety of the primary loop (7), and the half open loop (9) neither forms a continuous recirculation loop nor forms part of a continuous recirculation loop.

2. A coating apparatus according to claim 1 comprising additionally one or more recirculating loops (8).

3. A coating apparatus according to claim 2, wherein the one or more recirculating loops (8) are positioned after the one or more primary loops (7) and before the half open loop (9).

4. A coating apparatus (1) for applying a coating on glass containers with a chemical compound comprising:

a housing (2) with a coating tunnel, a conveyer belt (3) moving the containers (20) through the coating tunnel from an inlet (5) to an outlet (6) of the said coating tunnel, one primary loop (7) that is a circuit that comprises a feed point of a coating compound and circulates a carrier gas or air loaded with the coating compound, an air inlet having a blow slot in proximity to the outlet (6) of the coating tunnel before the outlet (6) of the coating tunnel such that the air inlet is between the outlet and the primary loop (7) in a direction of the conveyance of the glass containers, for introducing fresh air enriched with at least a part of the gas comprising the coating generating compound into a half open loop (9), said half open loop (9) beginning from the outlet (6) and ending at the inlet (5) of the coating tunnel, being configured to transport said fresh air enriched with the coating compound and carrier gas from the outlet (6) to the inlet (5) of the coating tunnel, such that at least a part of any non-used coating compound from the outlet of the coating tunnel re-enters the coating tunnel at the beginning of the tunnel for re-use, wherein the conveyor belt (3) delivers the glass containers (20) along a glass container path in a downstream direction, wherein the half open loop (9) includes (i) a first segment that is positioned downstream, as viewed along the glass container path, of an entirety of the primary loop (7), and (ii) a second segment that is fluidly connected to the first segment and positioned upstream, as viewed along the glass container path, of the entirety of the primary loop (7), and the half open loop (9) neither forms a continuous recirculation loop nor forms part of a continuous recirculation loop.

5. A coating apparatus (1) for applying a coating on glass containers with a chemical compound comprising:

a housing (2) with a coating tunnel a conveyer belt (3) moving the containers (20) through the coating tunnel from the inlet (5) to the outlet (6) of the said coating tunnel one primary loop (7) that is a circuit that comprises a feed point of a coating compound and circulates a carrier gas or air loaded with the coating compound a half open loop (9) beginning from the outlet (6) and ending to the inlet (5) of the coating tunnel, that transports fresh air enriched with the coating compound and carrier gas from the outlet (6) to the inlet (5) of the coating tunnel wherein the conveyor belt (3) delivers the glass containers (20) along a glass container path in a downstream direction, wherein the half open loop (9) includes (i) a first segment that is positioned downstream, as viewed along the glass container path, of an entirety of the primary loop (7), and (ii) a second segment that is fluidly connected to the first segment and positioned upstream, as viewed along the glass container path, of the entirety of the primary loop (7), and the half open loop (9) neither forms a continuous recirculation loop nor forms part of a continuous recirculation loop.

* * * * *